United States Patent [19]

Voigt

[11] Patent Number: 5,479,337

[45] Date of Patent: Dec. 26, 1995

[54] VERY LOW POWER LOSS AMPLIFIER FOR ANALOG SIGNALS UTILIZING CONSTANT-FREQUENCY ZERO-VOLTAGE-SWITCHING MULTI-RESONANT CONVERTER

[75] Inventor: William C. Voigt, San Francisco, Calif.

[73] Assignee: Kaiser Aerospace and Electronics Corporation, San Jose, Calif.

[21] Appl. No.: 159,281

[22] Filed: Nov. 30, 1993

[51] Int. Cl.⁶ .......................... H02M 7/537; G05F 1/10; H03F 3/38
[52] U.S. Cl. .............. 363/131; 363/16; 363/97; 323/235; 323/282; 330/10
[58] Field of Search .................. 363/16, 17, 19, 363/21, 23, 25, 40, 41, 95, 97, 98, 123, 131, 132; 323/222, 223, 235, 282, 287, 288, 289, 319; 330/10, 207 A, 251

[56] References Cited

U.S. PATENT DOCUMENTS

| | | | |
|---|---|---|---|
| Re. 33,333 | 9/1990 | Taylor, Jr. et al. | 330/10 |
| 4,178,556 | 12/1979 | Attwood | 330/10 |
| 4,182,992 | 11/1980 | Attwood | 330/251 |
| 4,560,946 | 12/1985 | Yokoyama | 330/149 |
| 4,628,275 | 12/1986 | Skipper et al. | 330/10 |
| 4,717,884 | 1/1988 | Mitzlaff | 330/251 |
| 4,720,668 | 1/1988 | Lee et al. | 323/271 |
| 4,724,396 | 2/1988 | Taylor, Jr. et al. | 330/10 |
| 4,743,858 | 5/1988 | Everard | 330/10 |
| 4,871,980 | 10/1989 | Gulczynski | 330/295 |
| 4,980,649 | 12/1990 | Gulczynski | 330/10 |
| 5,004,969 | 4/1991 | Schanin | 323/235 |
| 5,065,300 | 11/1991 | Jacobson et al. | 363/131 |
| 5,066,900 | 11/1991 | Bassett | 323/224 |
| 5,067,066 | 11/1991 | Chida | 363/16 |
| 5,097,196 | 3/1992 | Schoneman | 323/235 |
| 5,140,512 | 8/1992 | O'Sullivan | 363/24 |
| 5,265,003 | 11/1993 | Kayser et al. | 363/131 |
| 5,359,278 | 10/1994 | Notohara | 323/282 |
| 5,377,091 | 12/1994 | Faulk | 363/97 |
| 5,396,412 | 3/1995 | Barlage | 323/282 |
| 5,410,467 | 4/1995 | Smith et al. | 363/131 |

OTHER PUBLICATIONS

Brian E. Attwood, A. 0.5MHz Switching DC–AC Inverter Topology Provides Low EMI Environments for Critical Spacecraft Applications, Brian E. Atwood, *Proceedings of Powercon II*, B–3, pp. 1–16, Power Concepts, Inc. 1984.

Brian E. Atwood, Design Parameters Important for Optimization of Very High Fidelity PWM (Class D) Audio Amplifiers, *Audio Engineering Society Preprint*, (presented at 71st Convention Mar. 2–5, 1982).

Richard Farrington, Milan M. Jovanovic and Fred C. Lee, Constant–Frequency Zero–Voltage–Switched Multi–Resonant Converters: Analysis, Design, and Experimental Results, *PESC*, Jun. 1990.

Steve Freeland and R. D. Middlebrook, A Unified Analysis of Converters with Resonant Switches, *IEEE*, 1987.

Duncan A. Grant, John Gowar, *Power MOSFETS: Theory and Applications*, pp. 239–256 (John Wiley & Sons, Inc., 1989).

Duncan A. Grant, John Gowar, *Power MOSFETS: Theory and Applications*, pp. 313–321 (John Wiley & Sons, Inc., 1989).

Jon Mark Hancock, Circuit Techniques, for a 0.5 MHz Class D Power Conversion System Using MOSFETs, *HFPC May 1988 Proceedings*, pp. 151–164.

(List continued on next page.)

*Primary Examiner*—Matthew V. Nguyen
*Attorney, Agent, or Firm*—Townsend and Townsend and Crew

[57] ABSTRACT

A high-efficiency analog power amplifier is disclosed. The amplifier utilizes pulse-width-modulation ("PWM") signals to operate electrical switching devices coupled in series across a d.c. power source. A resonant circuit coupled to the transistors periodically places zero and non-zero voltage levels across each transistor. The frequency and width of the PWM signals are relative to the components of the resonant circuit—enabling each transistor to switch off and on only when zero volts appears across the transistor.

16 Claims, 9 Drawing Sheets

OTHER PUBLICATIONS

Milan M. Jovanovic, Richard Farrington and Fred C. Lee, Constant–Frequency Multi–Resonant Converters, pp. 56–65.

Kwang–Hwa Liu, Ramesh Oruganti and Fred C. Lee, Resonant Switches–Topologies and Charateristics, *IEEE*, 1985, pp. 106–116.

Dragan Maksimovic and Slobodan Cuk, Constant–Frequency Control of Quasi–Resonant Converters, *HFPC May 1989 Proceedings*, pp. 241–253.

Ken C. Pohlmann, *Principles of Digital Audio*, pp. 71–76 (2d ed., by Howard W. Sams, Inc., 1989).

Richard Redl, Bela Molnar and Nathan O. Sokal, Class E Resonant Regulated DC/DC Power Converters: Analysis of Operations, and Experimental Results at 1.5 MHz, *IEEE Transactions on Power Electronics*, vol. PE–1, No. 2, Apr. 1986, pp. 111–120.

Wojciech A. Tabisz aand Fred C. Lee, Zero–Voltage–Switching Multi–Resonant Technique–A Novel Approach to Improve Performance of High–Frequency Quasi–Resonant Converters, *Presented at the Power Electronics Specialist Conference*, Apr. 1988.

M. E. Van Valkenburg, *Analog Filter Design*, pp. 365–378 (Holt, Rinehart and Winston, Inc., 1982).

Richard Farrington, Milan M. Jovanovic, and Fred C. Lee, A New Family of Isolated Zero–Voltage–Switched Converters, *Presented at the Power Electronics Specialist Conference*, Apr. 1991.

Nathan O. Sokal and Alan D. Sokal, Class E–A New Class of High–Efficiency Tuned Single–Ended Switching Power Amplifiers, *IEEE Journal of Solid–State Circuits*, vol. SC–10, No. 3, Jun. 1975, pp. 168–176.

David C. Hamill, Time Reversal Duality and the Synthesis of a Double Class E DC–DC Converter, *Presented at the Power Electronics Specialist Conference*, Apr. 1990.

Slobodan Cuk and Robert W. Erickson, A Conceptually New High–Frequency Switched–Mode Power Amplifier Technique Eliminates Current Ripple, *Proceedings of Powercon 5*, May 1978.

Farhad Barczegar and Slobodan Cuk, A New Switched–Mode Amplifier Produces Clean Three–Phase Power, *Proceedings of Powercon 9*, Jul. 1982.

Brian E. Attwood, A New Subcarrier–Mode Power Conversion Topology Optimizes Very High–Frequency Off–Line Converter Performance, *Proceedings of Powercon 9*, Jul. 1982.

Nicholas John Tsaconmangos, The Implementation of an F.E.T. Four–Quadrant Cuk Converter, *Proceedings of Powercon 11*, Apr. 1984.

H. L. N. Wiegman, D. M. Divan, D. W. Novotnoy, and Robert Mohan, A ZVS Dual Resonant Converter for Battery Charging Applications, *Presented at Power Electronics Specialist Conference*, 1991.

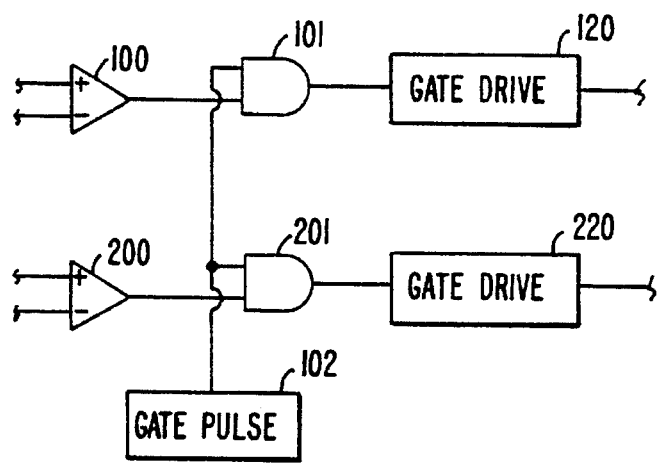
FIG. 9.
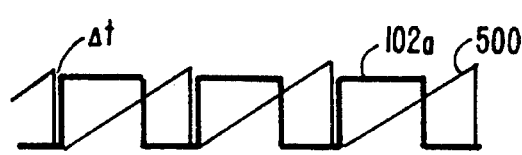
FIG. 10.
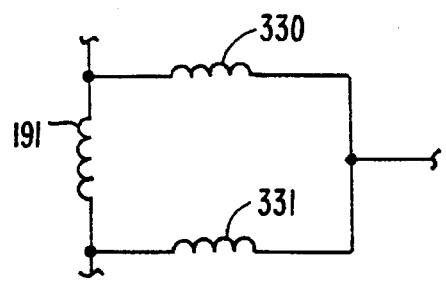
FIG. 11.
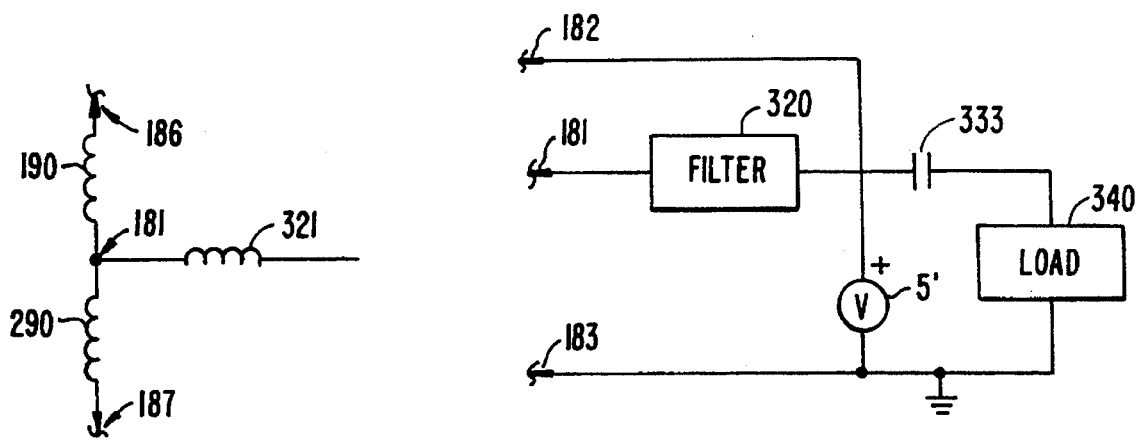
FIG. 12.
FIG. 13.

VERY LOW POWER LOSS AMPLIFIER FOR ANALOG SIGNALS UTILIZING CONSTANT-FREQUENCY ZERO-VOLTAGE-SWITCHING MULTI-RESONANT CONVERTER

BACKGROUND OF THE INVENTION

The present invention relates generally to high efficiency analog power amplifiers and, more specifically, to pulse-width-modulation ("PWM") type amplifiers and zero-voltage-switching multiresonant converters.

A typical PWM-type amplifier, i.e., the Class D amplifier, includes a comparator circuit coupled to the gates (or bases) of a pair of switching transistors that are coupled in series across a d.c. power source. The transistors are disposed in a conventional push-pull configuration. Reverse current bypassing or recovery diodes are also coupled in series across the d.c. power source, the junction of the diodes being coupled to the junction of the paired transistors. A low-pass filter is coupled to the junction of the paired transistors.

The comparator creates a rectangle-wave PWM signal from a modulating input signal and a triangle-wave carrier signal. The PWM signal is applied to the gates of the switching transistors, causing the transistors to be alternately switched on and off in accordance with the duration of the PWM pulses. The resulting demodulated signal passes through the low-pass filter and is output to a load.

Although highly efficient, conventional Class D amplifiers are subject to several drawbacks. The frequency of pulse width modulation in conventional Class D amplifiers is limited to a maximum of approximately 1 Mhz due to transistor switching losses. As a transistor is turned on and off rapidly, switching transients involving high levels of current and voltage occur, whereby high switching stresses and losses are imposed upon the switch. (A detailed discussion of such stresses and losses may be found in U.S. Pat. No. 4,720,668, issued to Lee et al.) As a result, Class D amplifiers are restricted to operate in a bandwidth of approximately 50 to 100 Khz. Such limitation can preclude the use of Class D amplifiers in high frequency applications since, for minimum distortion, the switching frequency of these amplifiers should be at least five times that of the highest frequency component of the modulating input signal. See, Grant, et al., *Power Mosfets Theory and Applications*, 314 (Wiley 1989).

Furthermore, Class D amplifiers generate output distortion when their switching transistors are not operating simultaneously (i.e., one turning off while the other is turning on). This differential switching error can result in "switch conduction overlap;" i.e., both transistors conducting simultaneously and thereby creating a virtual short circuit between the terminals of the d.c. power source. Overlapping conduction can result in very high peak currents flowing between terminals of the d.c. power source which can cause distortion as well as dissipation and device rating problems.

An additional cause of output distortion in conventional Class D amplifiers is pulse amplitude error (i.e., crossover distortion) over the analog cycle of the modulating input signal. As noted above, Class D amplifiers include a pair of switching transistors and recovery diodes. When an analog input signal passes from a positive to negative half cycle, effective output drive is transferred from one transistor and recovery diode to the other. This transition generates a crossover distortion component into the output waveform resulting from recovery diode overswings and forward voltage drops of the "on" transistor.

Finally, Class D amplifier output is also subject to high-frequency ripple distortion derived from the frequency of the carrier signal used to create PWM waveforms.

In addition to amplifiers, the technique of PWM has been applied to the field of power converters. A conventional PWM-type converter includes two switches; an active switch (i.e., a switching transistor) and a passive switch (i.e., a diode). To minimize switching stresses and losses experienced when switching between on and off states (and thereby maximize switching frequencies), resonant circuits have been incorporated into PWM-type converters to establish zero-current or zero-voltage conditions at a switch at the time of switching. Devices employing this technique include zero-current-switching quasi-resonant converters ("ZCS-QRC"), zero-voltage-switching quasi-resonant converters ("ZVS-QRC"), zero-voltage-switching multi-resonant converters ("ZVS-MRC") and constant-frequency zero-voltage-switching multi-resonant converters ("CF-ZVS-MRC").

ZCS-QRCs utilize an inductor/capacitor resonant tank circuit to force current passing through the switching transistor to oscillate, whereby the current is reduced to zero prior to turn-off. FIG. 1 illustrates a zero-current quasi-resonant switch 600. In contrast, ZVS-QRCs utilize a resonant circuit to shape the switching transistor's voltage waveform so that voltage levels reduce to zero prior to turn on. This enables ZVS-QRCs to operate up to and beyond frequencies of 10 Mhz. FIG. 2 illustrates a zero-voltage quasi-resonant switch 601.

Further, ZVS-MRCs utilize a resonant circuit that enables both the transistor and diode to operate with zero-voltage switching, thereby improving the performance of ZVS-QRCs. FIG. 3 illustrates a zero-voltage multi-resonant switch 602. ZVS-MRCs utilize the junction capacitances of all semiconductor devices to form a multi-resonant circuit. Finally, replacing the passive switch (i.e., diode) of a ZVS-MRC with a second active switch (i.e., transistor) enables output power to be controlled at a constant frequency, thereby creating CF-ZVS-MRCs. FIG. 4 illustrates a constant-frequency zero-voltage multi-resonant switch 603.

A conventional CF-ZVS-MRC circuit is illustrated in FIG. 5. Switch one (S1) operates with a constant switching frequency $f_s$ (i.e., $f_s=1/T_s$) and fixed on-time duration while switch two (S2) operates with constant frequency and variable on-time duration, thereby providing control of output power. To achieve zero-voltage turn on, S1 and S2 are switched on and off while their currents flow through antiparallel diodes D1 and D2. When S1 is off and S2 is on, C1 resonates with L. When S1 is on and S2 is off, C2 resonates with L. And when both S1 and S2 are off, all three resonant elements resonate with each other. As a result of this resonance, the voltage across each switch reaches zero prior to the switch being enabled (i.e., placed in an on state). In operation, the voltage across a switch remains at zero while the switch is enabled, and oscillates between a nonzero value and zero when the switch is disabled.

Additional detail regarding each of the foregoing converters, including the CF-ZVS-MRC, is provided in the following patents and publications, the disclosures of which are all hereby incorporated by reference: U.S. Pat. No. 4,720,668 issued to Lee et al.; M. M. Jovanovic, R. Farrington and F. C. Lee, "Constant-Frequency Multi-Resonant Converters," Virginia Power Electronics Center, The Bradley Department of Electrical Engineering, Virginia Polytechnic Institute & State University (undated) (hereinafter, "Jovanovic"), 56–65; D. Maksimovic and S. Cuk, "Constant-Frequency Control of Quasi-Resonant Converters," *Technical Papers of the Fourth Annual High Frequency Power Conversion Conference*, 241–253 (May 1989) (hereinafter, "Maksimovic"); R. Farrington, M. M. Jovanovic and F. C. Lee, "Constant-Frequency Zero-Voltage-Switched Multi-Resonant Converters: Analysis, Design, and Experimental Results," *Power Electronics Specialists Conference Record*, Vol. 1, 197–205, (June 1990), and W. A. Tabisz and F. C. Lee, "Zero-Voltage-Switching Multi-Resonant Technique—A Novel Approach to Improve Performance of High-Frequency Quasi-Resonant Converters," *Power Electronics Specialists Conference Record*, 14–22 (April 1988).

SUMMARY OF THE INVENTION

An apparatus is disclosed that enables high efficiency analog power amplification having the advantages of existing PWM-type amplifiers without the 1 Mhz switching frequency limitation (and resulting 50-to-100 Khz bandwidth limitation) normally associated with these amplifiers. This apparatus may be used as a wideband magnetic yoke driving deflection amplifier, where approximately 500 KHz signal bandwidth is required.

In brief, the apparatus allows operation to an order of magnitude higher frequency than the prior art, is not subject to the detrimental shorting effects of switch conduction overlap and completely avoids crossover type distortion. Further, the balanced topology of the apparatus inputs zero ripple distortion at the output when a zero input signal is applied, and results in significantly reduced ripple over the entire output range. Finally, the simple modulator configuration of the apparatus results in fewer balance problems than conventional Class D amplifiers.

Accordingly, in one embodiment the invention provides a power amplifier including a resonant inductor network coupled to first and second nodes. A first electrical switching device, having a first control input, is coupled to the first node. This device couples and decouples the resonant inductor network to a relatively positive power source when switched on and off, respectively. The power amplifier also includes a second electrical switching device, having a second control input, coupled to the second node. This device couples and decouples the resonant inductor network to a relatively negative power source when switched on and off, respectively.

A first resonant capacitor is coupled across the first electrical switching device; this capacitor being selected to resonate with the resonant inductor network at a first frequency. Such resonance results in zero and non-zero voltage levels being periodically placed across said first electrical switching device. A first antiparallel diode is also coupled across the first electrical switching device. This diode starts to conduct when a zero voltage level is initially placed across the first electrical switching device.

A second resonant capacitor is coupled across the second electrical switching device; this capacitor being selected to resonate with the resonant inductor network at the first frequency. Such resonance results in zero and non-zero voltage levels being periodically placed across said second electrical switching device. A second antiparallel diode is also coupled across the second electrical switching device. This diode starts to conduct when a zero voltage level is initially placed across the second electrical switching device.

A first low-pass filter is coupled to the resonant inductor network. Further, a load is coupled to an electrical midpoint of the resonant inductor network through the low-pass filter.

Finally, means are coupled to said first and second electrical switching devices for providing first and second control signals to the first and second control inputs, respectively. The first control signal operates at a second frequency and switches the first electrical switching device on and off only when a zero voltage level is placed across this device. The second control signal operates at the second frequency and switches the second electrical switching device on and off only when a zero voltage level is placed across this device.

A further understanding of the nature and advantages of the invention may be realized by reference to the remaining portions of the specification and drawings.

BRIEF DESCRIPTION OF THE DRAWINGS

FIG. 9 is a schematic of electrical components added to the circuit of FIG. 6 to ensure synchronization of the starting edges of PWM signals;

FIG. 10 illustrates the relationship of signals generated by the gate pulse circuit of FIG. 9 and a ramp generator of FIG. 6;

FIG. 11 is a schematic of a resonant inductor and averaging filter configured in a "π" arrangement;

FIG. 12 is a schematic of a resonant inductor and an averaging filter configured in a "T" arrangement;

FIG. 13 is an alternate embodiment of a portion of the circuit shown in FIG. 6, replacing power supplies 4 and 5 with a single power supply 5';

DESCRIPTION OF THE PREFERRED EMBODIMENT

Contents

A. General Description of Circuit

B. Ramp Generator Circuit
C. Modulating Signal Input and Biasing Circuit
D. Comparator Circuit
E. Gate Drives
F. Resonant Circuit
G. Averaging Filter
H. Bridge Circuit
I. Component Value/Part Number

A. General Description of Circuit

Figure 6:
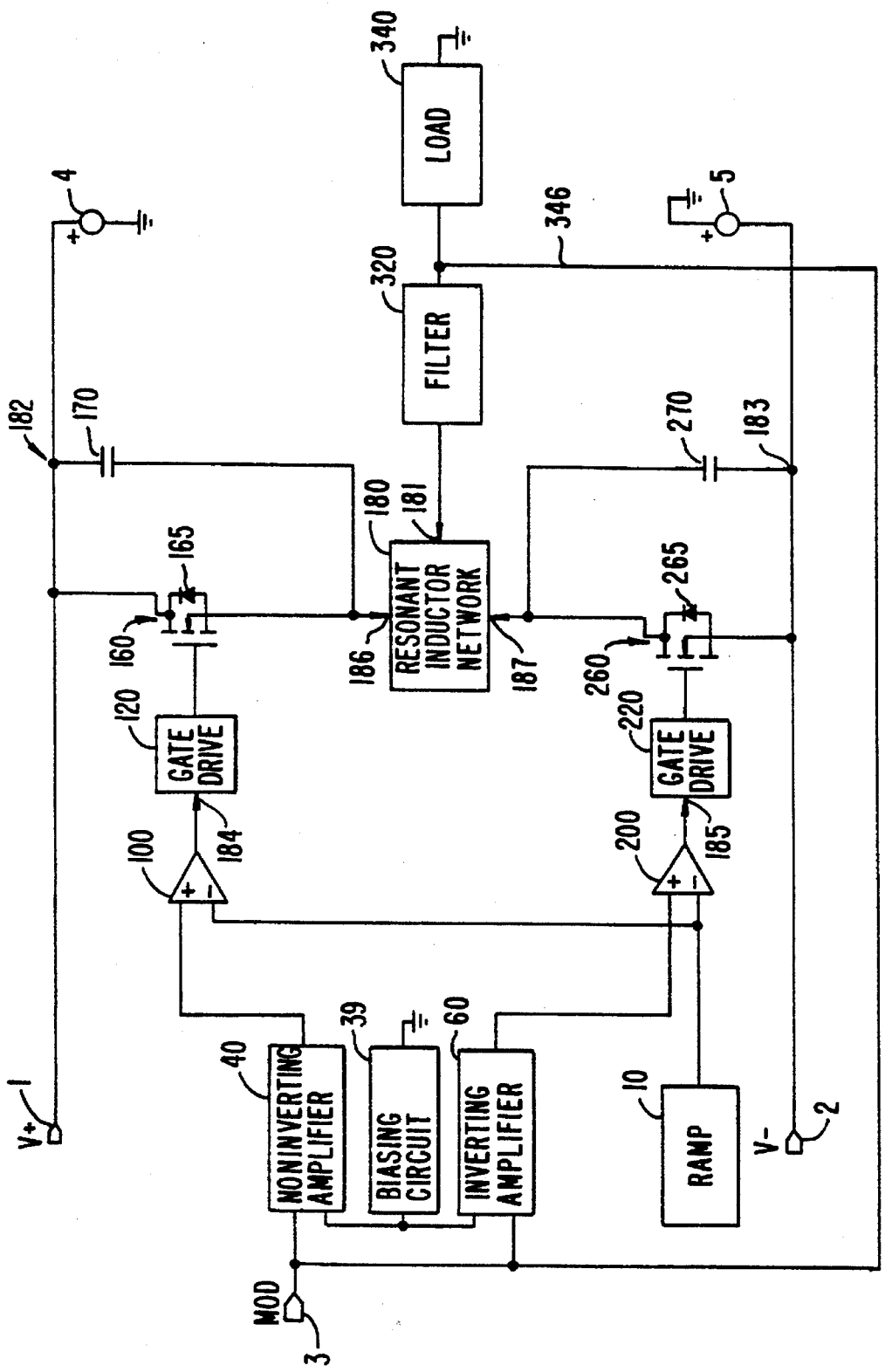
FIG. 6 is a schematic of an electrical circuit constructed according to the principles of the invention.

FIG. 6 provides an overview of an electrical circuit constructed according to the principles of the invention. Terminal 1 of positive d.c. power source 4 is coupled to switching transistor 160, antiparallel diode 165 and resonant capacitor 170. Similarly, terminal 2 of negative d.c. power source 5 is coupled to switching transistor 260, antiparallel diode 265 and resonant capacitor 270.

Although d.c. power sources 4 and 5 have voltage levels that are typically of equal value but opposite polarity, these sources may operate at unequal voltage levels if asymmetric output is desired. Furthermore, although switching transistors 160 and 260 are embodied as field-effect transistors ("FETs") in FIG. 6, it would be understood by one having ordinary skill in the art that these circuit elements may be replaced by other conventional switching devices, such as bipolar transistors and high-power-level tubes. Finally, although antiparallel diodes 165 and 265 are shown in FIG. 6 as being intrinsic diodes within the FETs, these devices may also be embodied as independent components.

Referring again to FIG. 6, a modulating-signal terminal 3 is coupled to noninverting and inverting amplifiers 40 and 60. These amplifiers are biased via biasing circuit 39 to ensure their output does not fall below zero volts. Amplifiers 40 and 60 are coupled to noninverting comparators 100 and 200, respectively. A ramp generator circuit 10 is also coupled to comparators 100 and 200.

Comparator 100 is coupled to gate drive circuit 120 which is, in turn, coupled to the gate of transistor 160. The source and drain of transistor 160 is coupled to antiparallel diode 165 and resonant capacitor 170. Transistor 160 is also coupled to resonant inductor network 180. Similarly, comparator 200 is coupled to gate drive circuit 220 which is, in turn, coupled to the gate of transistor 260. The source and drain of transistor 260 is coupled to antiparallel diode 265 and resonant capacitor 270. Transistor 260 is also coupled to resonant inductor network 180.

Network 180 is coupled to load 340 through averaging filter 320. Feedback line 346 couples the output of filter 320 with terminal 3.

Figure 7:
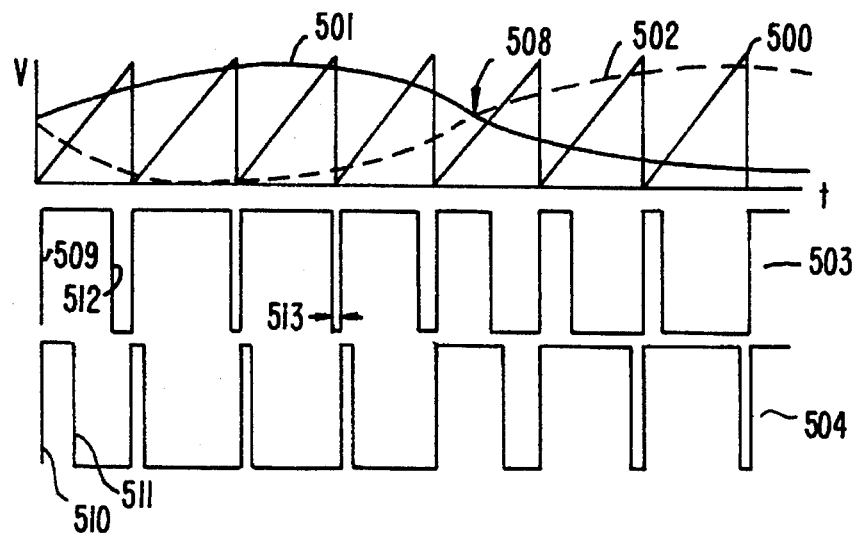
FIG. 7 illustrates PWM signals and a fixed-frequency ramp signal.

In operation, a modulating input signal applied to terminal 3 is input to noninverting amplifier 40 and inverting amplifier 60. Biasing circuit 39 raises the output of these amplifiers a sufficient quantity to ensure that amplifier output never falls below zero volts. Referring to FIG. 7, a hypothetical sine wave input at terminal 3 results in complementary signals 501 and 502 output from amplifiers 40 and 60, respectively. Signal 501 is fed into comparator circuit 100 while signal 502 is fed into comparator 200.

Ramp generator circuit 10, also coupled to comparators 100 and 200, produces a fixed-frequency periodic ramp or sawtooth signal 500, as shown in FIG. 7. This signal functions as a reference voltage for comparator operation. Comparators 100 and 200 compare the outputs of biasing circuits 40 and 60 with the output of ramp generator circuit 10, producing PWM rectangular signals. As shown in FIG. 7, PWM signals 503 and 504, based on hypothetical input signals 501 and 502, may be output from comparators 100 and 200, respectively. The pulse width of these signals varies according to the amplitude level of the modulating input signal. The preferred modulation of the PWM signals is to increase and decrease the falling-edge time of each pulse, without changing the rising-edge time.

The PWM signals output from comparators 100 and 200 pass through gate drive circuits 120 and 220, respectively. Transistors included in these circuits operate in non-saturated mode to provide rapid response to changes in the PWM signals. In addition, these circuits are designed for "fail safe" operation when alternating or non-alternating signals are applied to the inputs. During alternating signal operation, these circuits operate so that positive and negative d.c. power supplies (not shown in FIG. 6) are never shorted. During non-alternating signal operation, these circuits remain off, thereby minimizing the risk of erroneous operation from transient signals.

In normal operation, circuits 120 and 220 generate output voltages that swing above and below the threshold voltages of transistors 160 and 260, thereby switching these transistors on and off. Referring to PWM signals 503 and 504 shown in FIG. 7, transistor 160 may be switched in accordance with signal 503, while transistor 260 may be switched in accordance with signal 504. As these signals illustrate, transistors 160 and 260 switch on simultaneously, and then switch off when signals 501 and 502 fall below the value of sawtooth signal 500. Accordingly, the terminating edges of the pulses in signals 503 and 504 control the output of the amplifier.

For example, the circuit of FIG. 6 produces a positive average output voltage at node 181 when the pulses of waveform 504 fall first. In such an instance, positive d.c. power source 4 is coupled to node 181 through transistor 160 for a longer portion of each ramp period than negative power source 5 through transistor 260. Conversely, the circuit of FIG. 6 produces a negative average output voltage when the pulses of waveform 503 fall first. In this case, negative d.c. power source 5 is coupled to the output through transistor 260 for a longer portion of each ramp period than positive power source 1.

Significantly, the drain of transistor 160 is not directly connected to the source of transistor 260 when both transistors are switched on. Rather, resonant inductor network 180 inserts a high impedance between these devices for signals generated at the operating frequency of the transistors. Such impedance effectively eliminates any cross-conduction current spikes that would normally occur during overlapping conduction. (Exemplary resonant inductor networks 180 (coupled to filter 320) are shown in FIGS. 11 and 12, described below.)

Figure 1:
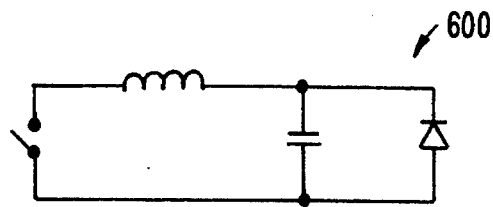
FIG. 1 is a schematic of a zero-current quasi-resonant switch.
Figure 2:
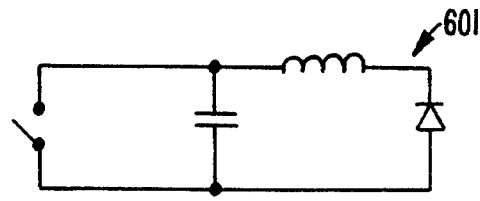
FIG. 2 is a schematic of a zero-voltage quasi-resonant switch.
Figure 3:
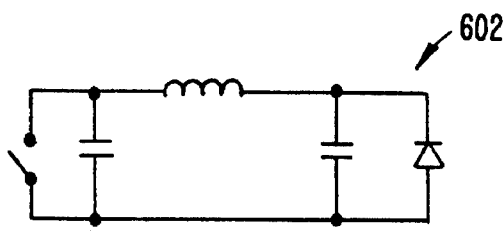
FIG. 3 is a schematic of a zero-voltage multi-resonant switch.
Figure 4:
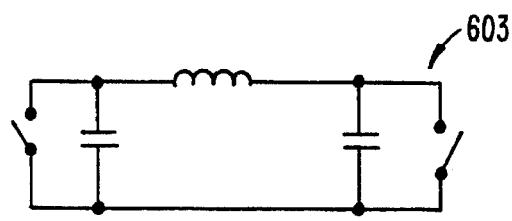
FIG. 4 is a schematic of a constant-frequency zero-voltage multi-resonant switch.
Figure 5:
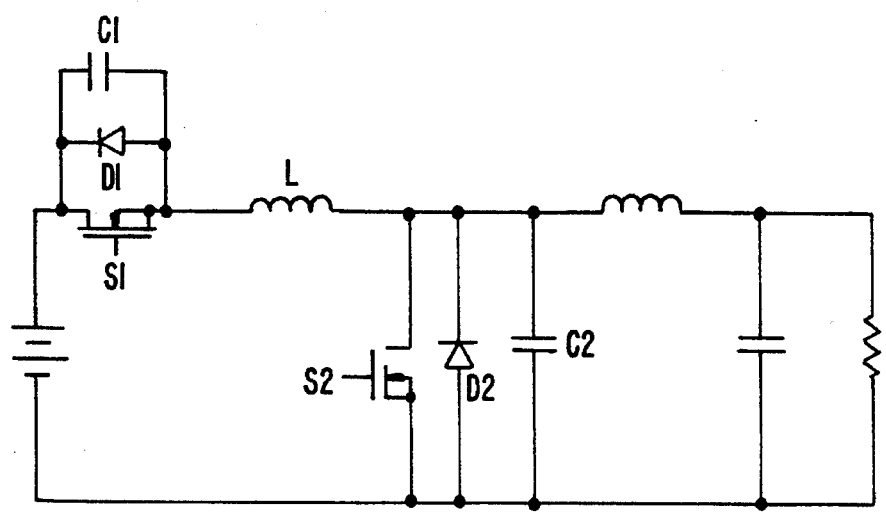
FIG. 5 is a schematic of a CF-ZVS-MRC.

In addition, the transition between positive and negative voltages of a modulating input signal results in no sudden change in circuit operation (i.e., no effective change as to which transistor is controlling the output signal). As shown in FIG. 7, the circuit provides unaltered operation through zero input volts; i.e., point 508. Accordingly, the circuit of FIG. 1 effectively avoids any crossover type distortion found in conventional Class D amplifiers.

Pulse width duration and switching frequency of the PWM signal generated by comparators 100 and 200 are relative to the resonant component values of resonant capacitors 170, 270 and resonant inductors contained in network 180 (i.e., inductors 190 and 290 of FIG. 12). As discussed below, these components create a resonant circuit, periodically placing zero and non-zero voltage levels across transistors 160 and 260 during amplifier operation. In accordance with the resonant characteristics of these elements, the PWM signals output from gate drives 120 and 220 switch transistors 160 and 260 on and off only when zero volts appears across each transistor. This concept is illustrated in FIG. 8.

Figure 8:
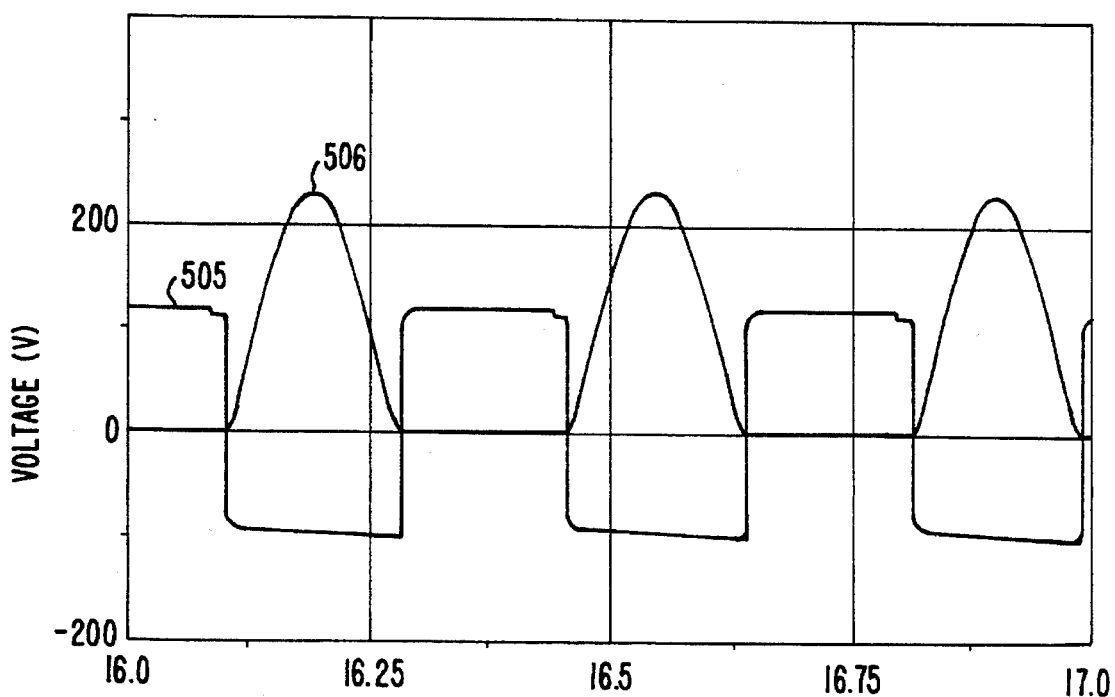
FIG. 8 illustrates the timing relationship of PWM signals applied to the gate of a switching transistor and resonating voltage levels applied across the source and drain of this transistor.

PWM signal 505, shown in FIG. 8, is output from gate drive 120 and applied to the gate of transistor 160. This signal switches transistor 160 on and off only when its drain-to-source voltage (i.e., $V_{ds}$), represented by waveform 506, equals zero. Transistor 260 operates in similar fashion, in accordance with PWM signal 504. Switching transistors 160 and 260 on and off when the drain-to-source voltage equals zero minimizes transistor switching stresses and losses, and enables switching frequencies of several megahertz. This feature is discussed in greater detail below.

The switching operation of transistors 160 and 260 generates noise or signal distortion typically referred to as output ripple. However, the balanced topology of the circuit of FIG. 6 results in zero output ripple when the input signal is zero since the voltages applied to inductors 190 and 290 are equal and opposite during the corresponding ramp period. Moreover, the presence of such inductors as 190 and 290 of FIG. 12 contribute to ripple reduction over the whole output range.

To ensure simultaneous "turn-on" of transistors 160 and 260, and thereby eliminate a potential source of output-signal distortion, a pair of logical AND circuits 101, 201 may be added to the circuit of FIG. 6 between comparators 100, 200 and gate drives 120, 220, respectively, as shown in FIG. 9. The output of comparators 100 and 200 are gated via AND circuits 101 and 201, respectively, under the control of gate pulse circuit 102. As shown in FIG. 10, square wave 102a, output from circuit 102, may be used to delay the leading edge of PWM signals output from comparators 100 and 200 some minimal Δt to ensure that both edges rise simultaneously.

Referring to FIG. 6, averaging filter 320 is shown coupled to resonant inductor network 180 at node 181. This portion of the amplifier may be configured in a variety of circuit architectures, as illustrated in FIGS. 11 and 12. As shown in FIG. 11, resonant inductor network 180 may be embodied as inductor 191, and filter 320 may include inductors 330 and 331, all configured in a "π" network. Alternatively, as shown in FIG. 12, network 180 may be embodied as inductors 190, 290, and filter 320 may include inductor 321 coupled to the electrical midpoint of network 180 in a "T" network. Averaging filter 320 helps to remove distortion from the output signal of the amplifier, including ripple distortion. The resulting signal is output to load 340, functioning as a current sink.

Feedback line 346 couples terminal 3 with the output of filter 320. This feedback line stabilizes the amplifier and reduces output distortion. Alternatively, the amplifier of FIG. 6 may be operated without feedback line 347.

Figure 14:
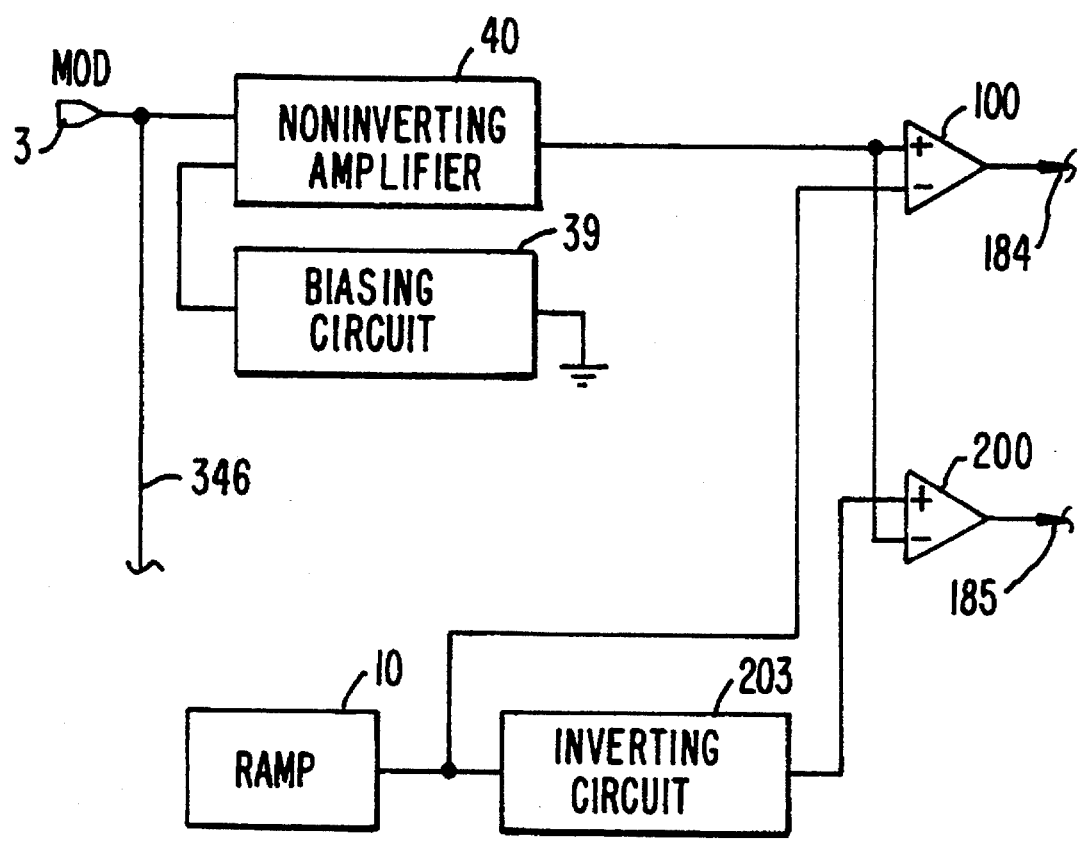
FIG. 14 is an alternate embodiment of a portion of the circuit shown in FIG. 6, utilizing an inverted ramp signal.

FIGS. 13 and 14 disclose two modifications to the circuit architecture of FIG. 6. FIG. 13 illustrates the use of a single power source 5' in place of voltage sources 4 and 5 shown in FIG. 6. Referring to FIG. 13, power source 5' is coupled to nodes 182 and 183, the latter also being coupled to ground. Filter 320 is coupled to node 181 and load 340 through blocking capacitor 333. Load 340 is also coupled to ground. Nodes 182–183 identify where this modification may be incorporated into the circuit of FIG. 6.

The modification of FIG. 13 offers a simpler architecture than that disclosed in FIG. 6 at the cost of losing low-frequency operation. Blocking capacitor 333 functions as a high-pass filter preventing low frequency signals from reaching load 340. As such, the circuit of FIG. 6 modified in accordance with FIG. 13 is not suited for d.c. operation.

FIG. 14 discloses a modification to the circuit of FIG. 6 wherein inverted and non-inverted output of the ramp generator circuit 10 are fed to comparators 100 and 200 while the modulating signal applied to terminal 3 remains non-inverted. As shown in FIG. 14, noninverting comparator 100 uses a non-inverted modulating signal as an input and a non-inverted ramp output as a reference voltage. This is identical to the configuration of FIG. 6. However, comparator 200 uses an inverted ramp output (via inverting circuit 203) as an input signal and a non-inverted modulating signal as a reference voltage. The resulting PWM signals are the same as those shown in FIG. 7 and described above.

A detailed schematic of the circuit of FIG. 6 is illustrated in FIGS. 15 through 18, which are discussed below.

B. Ramp Generator Circuit

Figure 15:
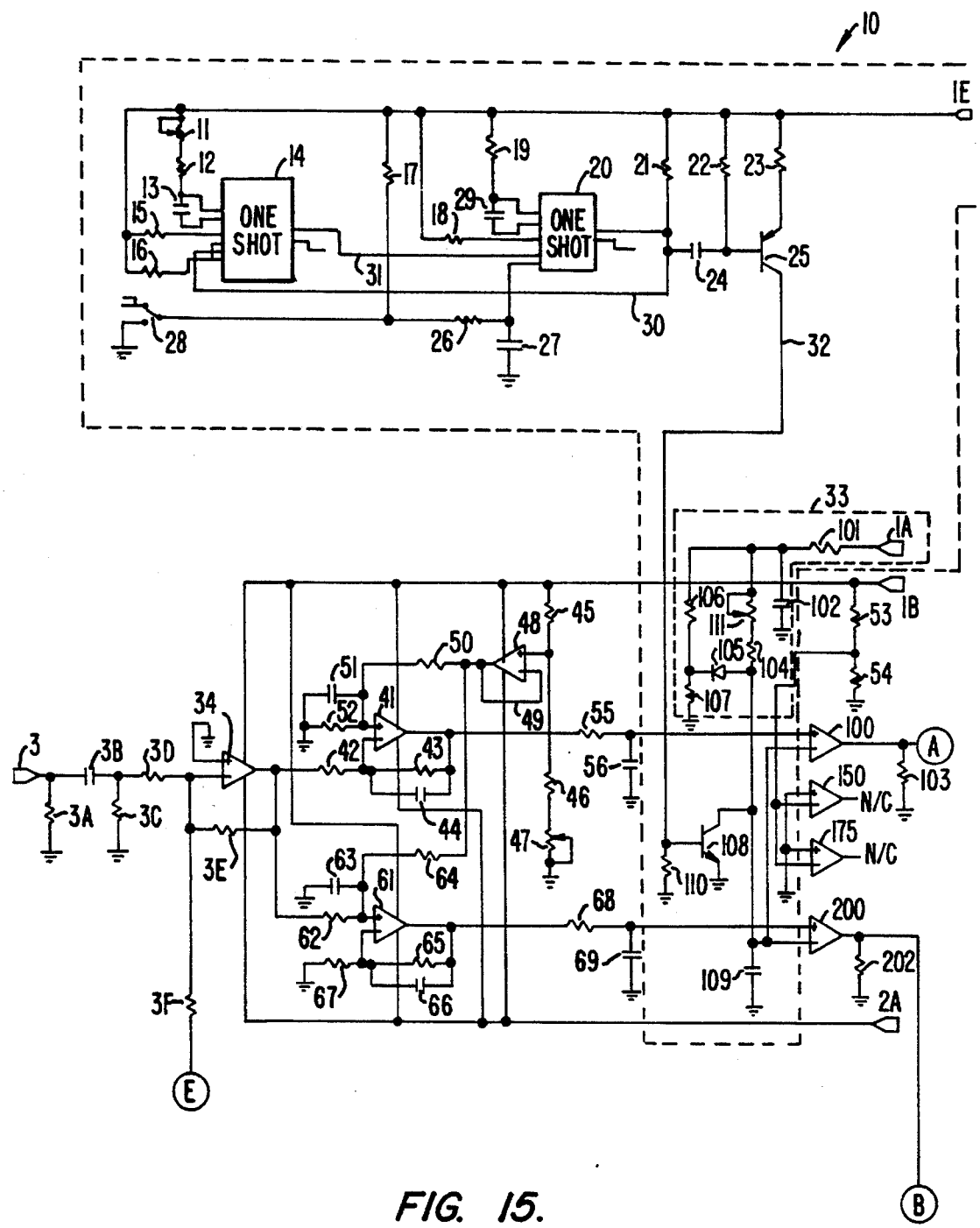
FIG. 15 is a schematic of a ramp generating circuit, biasing circuit and comparator circuits constructed according to the principles of the invention.

As shown in FIG. 15, ramp generator circuit 10 includes two one-shot circuits 14 and 20, which may be Texas Instruments part number SN54LS221. Pins 1 (input), 2 (input) and 3 (clear) of circuit 14 are connected to resistors 21, 16 and 15, respectively. These resistors are, in turn, connected to positive d.c. power source 1E. Pin 13 (Q output) of circuit 14 is connected to pin 9 (input) of one-shot circuit 20 via line 31. Pins 14 ($C_{ext}$) and 15 ($R_{ext}/C_{ext}$) of circuit 14 are connected to capacitor 13, which is connected to resistor 12. Resistor 11 interconnects resistor 12 and positive d.c. power supply 1E.

Pins 5 (Q output), 10 (input) and 11 (clear) of circuit 20 are connected to resistors 21, 18 and 26, respectively. Resistor 21 is coupled to the base of transistor 25 through capacitor 24. Resistor 26 interconnects enable switch 28 with capacitor 27, which is connected to ground. Pin 5 of circuit 20 is connected to pin 1 of circuit 14 via line 30. Pins 6 ($C_{ext}$) and 7 ($R_{ext}/C_{ext}$) of circuit 20 are connected to capacitor 29 which is, in turn, connected to resistor 19. D.C. power source 1E is also connected to resistors 17, 19, 22 and 23. Resistor 17 is also connected to resistor 26 and switch 28. Resistors 22 and 23 are connected to the base and emitter, respectively of transistor 25.

In operation, circuit 14 is triggered by the falling edge of an input pulse. As shown in FIG. 15 and described above, control input pin 1 of circuit 14 is connected to output pin 5 of circuit 20 via line 30. Accordingly, when the output of circuit 20 falls, circuit 14 generates an output pulse. The width of this pulse is determined by the values of capacitor 13 and resistors 11, 12.

Similarly, circuit 20 is triggered by the falling edge of an input pulse. As shown in FIG. 15 and described above, control input pin 9 of circuit 20 is connected to output pin 13 of circuit 14 via line 31. Accordingly, when the output of circuit 14 falls, circuit 20 generates an output pulse. The width of this pulse is determined by the values of capacitor 29 and resistor 19. In summary, one-shot circuits 14, 20 periodically trigger each other.

Output pulses of circuits 14 and 20 are configured to occupy approximately eighty and twenty percent of a ramp period, respectively. Keeping circuit 20 off for a majority of this period helps reduce distortion by preventing any perceptible noise from being output from the ramp generator circuit during this time.

The output pulse of circuit 20, in combination with capacitor 24, enables transistor 25 to periodically conduct and convey a sharp pulse of current that is used to terminate a ramp pulse, as discussed below. The operating parameters of one-shot circuits 14, 20 embodied as Texas Instruments part number SN54LS221 are described in *The TTL Data Book for Design Engineers*, 6-68 to 6-75 (Texas Instruments 1976), the disclosure of which is hereby incorporated by reference.

The remaining portion of ramp generator circuit 10 includes resistor 110 connected to line 32 and ground, and transistor 108, whose base is also connected to line 32. The emitter of transistor 108 is connected to ground while the collector is connected to capacitor 109, the inverting input of comparators 100 and 200, and power supply circuit 33.

Circuit 33 includes positive d.c. power source terminal 1A which is connected to resistor 101. This resistor is connected, in turn, to capacitor 102, and resistors 111, 106. Capacitor 102 is connected to ground, resistor 111 is connected to resistor 104, and resistor 106 is connected to resistor 107 and the cathode of diode 105. Resistor 107 is also connected to ground, while the anode of diode 105 is connected to resistor 104, and the collector of transistor 108.

Circuit 33 conveys charging current to capacitor 109. When transistor 108 is not conducting, circuit 33 gradually charges capacitor 109, creating the inclined portion of ramp signal 500 shown in FIG. 7. When a current pulse is generated by transistor 25 and applied to the base of transistor 108, capacitor 109 discharges through transistor 108 resulting in the vertical drop of signal 500 shown in FIG. 7. This operation is repeated pursuant to the periodic output pulses generated by one-shot circuits 14, 20. Accordingly, a train of periodic ramp pulses (i.e., a sawtooth signal 500) is created for use as a reference voltage by comparators 100 and 200.

C. Modulating Signal Input and Biasing Circuit

Referring again to FIG. 15, modulating-signal terminal 3 is connected to resistor 3A and capacitor 3B, which is, in turn, connected to resistors 3C, 3D. Resistors 3A and 3C are also connected to ground. Resistor 3D is connected to resistors 3E, 3F and the inverting input of amplifier 34. The noninverting input of amplifier 34 is grounded. Resistor 3E is also connected to the output of amplifier 34, which operates as an inverting amplifier. Amplifier 34 inverts a modulating input signal being received on terminal 3.

The output of amplifier 34 is connected to resistors 42, 62 and 3E. Resistor 42 is connected to the inverting input of inverting amplifier 41, resistor 43 and capacitor 44. These last two elements are also connected to the output of amplifier 41. The noninverting input of amplifier 41 is connected to resistors 50, 52 and capacitor 51; these last two elements also being connected to ground. Resistor 50 is connected to the output of amplifier 48, which functions as a voltage follower. The inverting input of amplifier 48 is connected to its output via lead 49. The noninverting input is connected to resistors 45 and 46. Resistor 46 is coupled to ground through variable resistor 47. Resistor 45 is connected to d.c. power source 1B and resistor 53, which is coupled to ground through resistor 54. The output of inverting amplifier 41 is coupled to the noninverting input of comparator 100 through a low pass filter constructed from resistor 55 connected to capacitor 56.

The values of resistors 42, 43, 50 and 52 are selected so that inverting amplifier 41 functions as an inverting difference amplifier. As such, the voltage applied to the noninverting input of amplifier 41 by voltage-follower 48 serves to raise the output signal of amplifier 41 some predefined amount. In this case, the output signal is raised so that it never falls below zero. (See, for example, signal 501 in FIG. 7.) This is necessary to enable a proper comparison with ramp signal 500 (which also never falls below zero) in comparator 100. Although amplifier 41 performs an inverting operation, its output is, in fact, non-inverted with respect to an input signal applied to terminal 3, since such signal must also pass through inverting amplifier 34.

Turning to amplifier 61, the noninverting input of this amplifier is connected to resistors 62, 64 and capacitor 63, which is also connected to ground. Resistor 64 is also connected to the output of voltage-follower amplifier 48. The inverting input to amplifier 61 is connected to resistors 65, 67 and capacitor 66. Resistor 67 is connected to ground while resistor 65 and capacitor 66 are also connected to the output of amplifier 61. The output of noninverting amplifier 61 is coupled to the noninverting input of comparator 200 through a low pass filter constructed from resistor 68 connected to capacitor 69.

The values of resistors 62, 64, 65 and 67 are selected so that noninverting amplifier 61 functions as a noninverting difference amplifier. Amplifiers 41 and 61 operate as a pair of balanced difference amplifiers. Like amplifier 41, voltage-follower 48 raises the voltage applied to the noninverting input of amplifier 61 a sufficient level so that the output of this amplifier never falls below zero. (See, for example, signal 502 in FIG. 7.) Again, this is necessary to ensure a proper comparison with ramp signal 500 in comparator 200. Although amplifier 61 performs a noninverting operation, its output is, in fact, inverted with respect to an input signal applied to terminal 3, since such signal must also pass through inverting amplifier 34.

D. Comparator Circuit

The use of comparator circuits to produce PWM rectangular waves is well-known by those having ordinary skill in the art. The circuit of FIG. 15 uses conventional devices such as MAXIM™ MAX900™ series comparators, which are configured in a "quad" package (i.e., a single IC package containing comparators 100, 150, 175 and 200). Comparators 150 and 175 are not used in the circuit of FIG. 15. Accordingly, to prevent any interference with those comparators that are used (i.e., comparators 100, 200), comparators 150 and 175 are configured to maintain a permanently low output. Specifically, each unused comparator has its noninverting input coupled to ground, and its inverting input coupled to the junction of resistors 53 and 54. The output of these unused comparators remain unconnected.

For purposes of illustrating comparator operation, assume modulating signal 501 of FIG. 7 is output from inverting difference amplifier 41, and ramp signal 500 of FIG. 7 is generated by the gradual charging of capacitor 109. In this situation, comparator 100 would generate a PWM rectangular signal analogous to signal 503 of FIG. 7. Similarly, assuming modulating signal 502 is output from noninverting difference amplifier 61, comparator 200 would generate a PWM rectangular signal analogous to signal 504 of FIG. 7.

In accordance with the circuit of FIG. 15, comparators 100 and 200 output a non-modulated, low signal when ramp generator circuit 10 has not yet been switched on by enable switch 28. In such a situation, capacitor 109 charges up as described above, but fails to discharge. This creates a permanently high voltage reference signal for comparators 100 and 200. Accordingly, the value of any signals output from amplifiers 41, 61 are always below the input reference voltage of each comparator. As noted below, an initially low output on comparators 100 and 200 provides a particularly useful starting point for amplifier operation.

Alternatively, when sawtooth signal 500 is applied to comparators 100, 200, but the input signal applied to terminal 3 remains at zero, comparators 100 and 200 simultaneously switch on and off since the signals output from amplifiers 41 and 61 are identical. As noted above, this operation results in a particularly clean output signal (i.e., no output ripple).

The output of comparators 100 and 200 are forwarded to gate drives 120 and 220. As shown in FIGS. 14 and 15, the output of comparator 100 is connected to resistor 103 and the bases of transistors 126, 131 of gate drive 120. Similarly, the output of comparator 200 is connected to resistor 202 and the bases of transistors 226, 231 of gate drive 220. Resistors 103, 202 are also connected to ground.

E. Gate Drives

Figure 16:
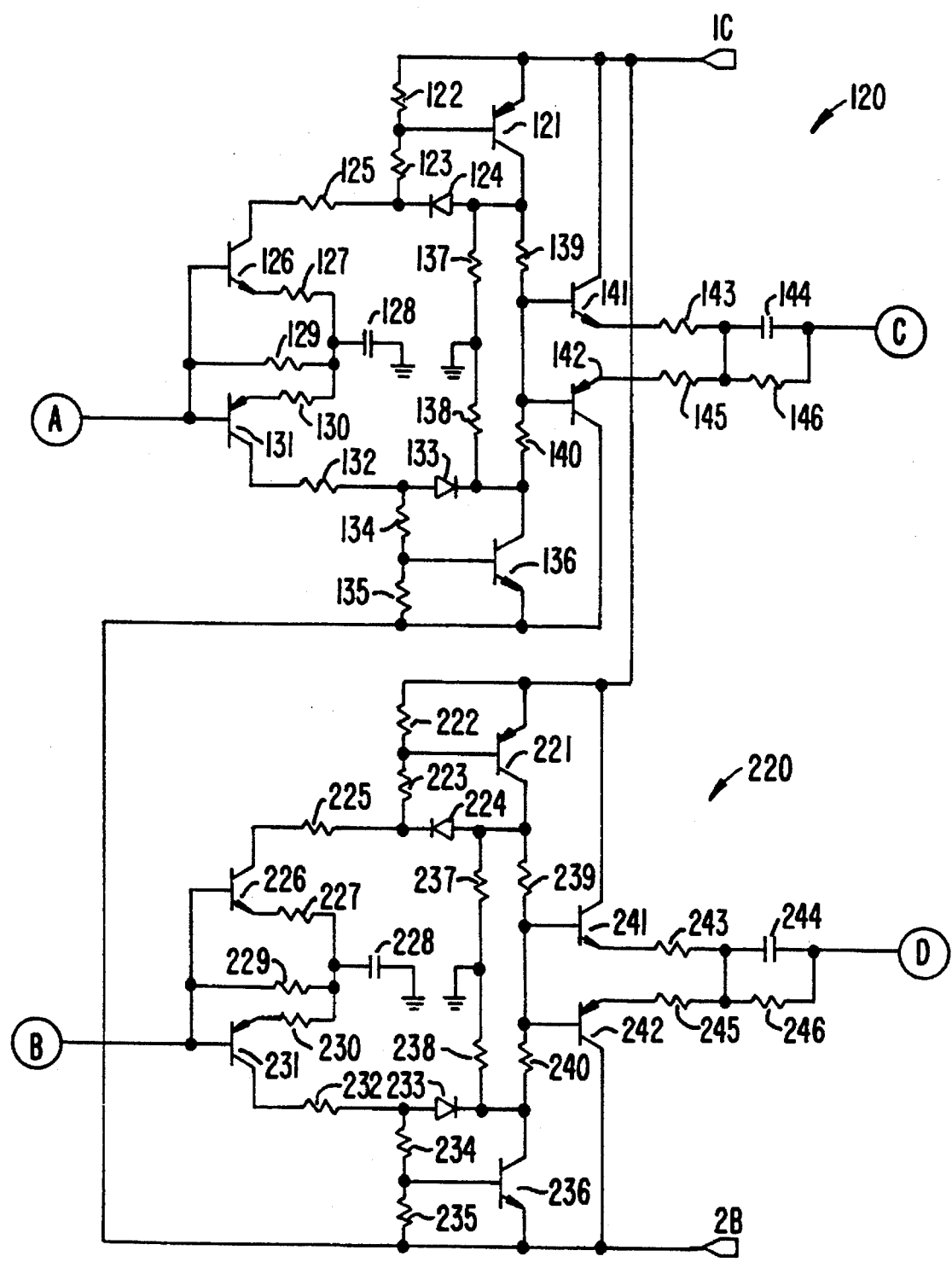
FIG. 16 is a schematic of switch gate drives constructed according to the principles of the invention.

As shown in FIG. 16, gate drive 120 is coupled to d.c. power sources 1C, 2B, comparator 100 and transistor 160. More specifically, d.c. power source 1C is connected to resistor 122, the emitter of transistor 121 and collector of transistor 141. Resistor 122 is, in turn, connected to the base of transistor 121 and resistor 123. Resistor 123 is also connected to the cathode of diode 124 and resistor 125. The anode of diode 124 is connected to the collector of transistor 121 and resistors 137, 139, while resistor 125 is connected to the collector of transistor 126. Diode 124 acts as a clamping diode (i.e., a Baker clamp), preventing transistor 121 from saturating during operation.

Transistors 126 and 131 are coupled in series through resistors 127 and 130. The junction of these resistors are coupled to ground via capacitor 128, and to the bases of transistors 126, 131 through resistor 129. These bases are also connected to the output of comparator 100.

The collector of transistor 131 is connected to resistor 132 which is, in turn, connected to the anode of diode 133 and resistor 134. Resistor 134 is, in turn, connected to the base of transistor 136 and resistor 135. The emitter of transistor 136 and resistor 135 are connected to negative d.c. power source 2B. The cathode of diode 133 is connected to resistors 138, 140 and the collector of transistor 136. Like diode 124, diode 133 acts as a clamping diode (i.e., a Baker clamp), preventing transistor 136 from saturating during operation.

Resistors 137 and 138 are connected in series, and their junction is connected to ground. Resistors 139 and 140 are also connected in series, and their junction is connected to the bases of transistors 141 and 142. These transistors are prevented from saturating due to the Baker clamp drivers mentioned above. The collector of transistor 142 is connected to negative d.c. power source 2B. The collector of transistor 141 is connected to positive d.c. power source 1C, and the emitter is coupled to isolating transformer 147 (FIG. 17) through resistor 143 and capacitor 144. These elements are also coupled to resistors 145, 146, which form a path to the emitter of transistor 142.

Figure 17:
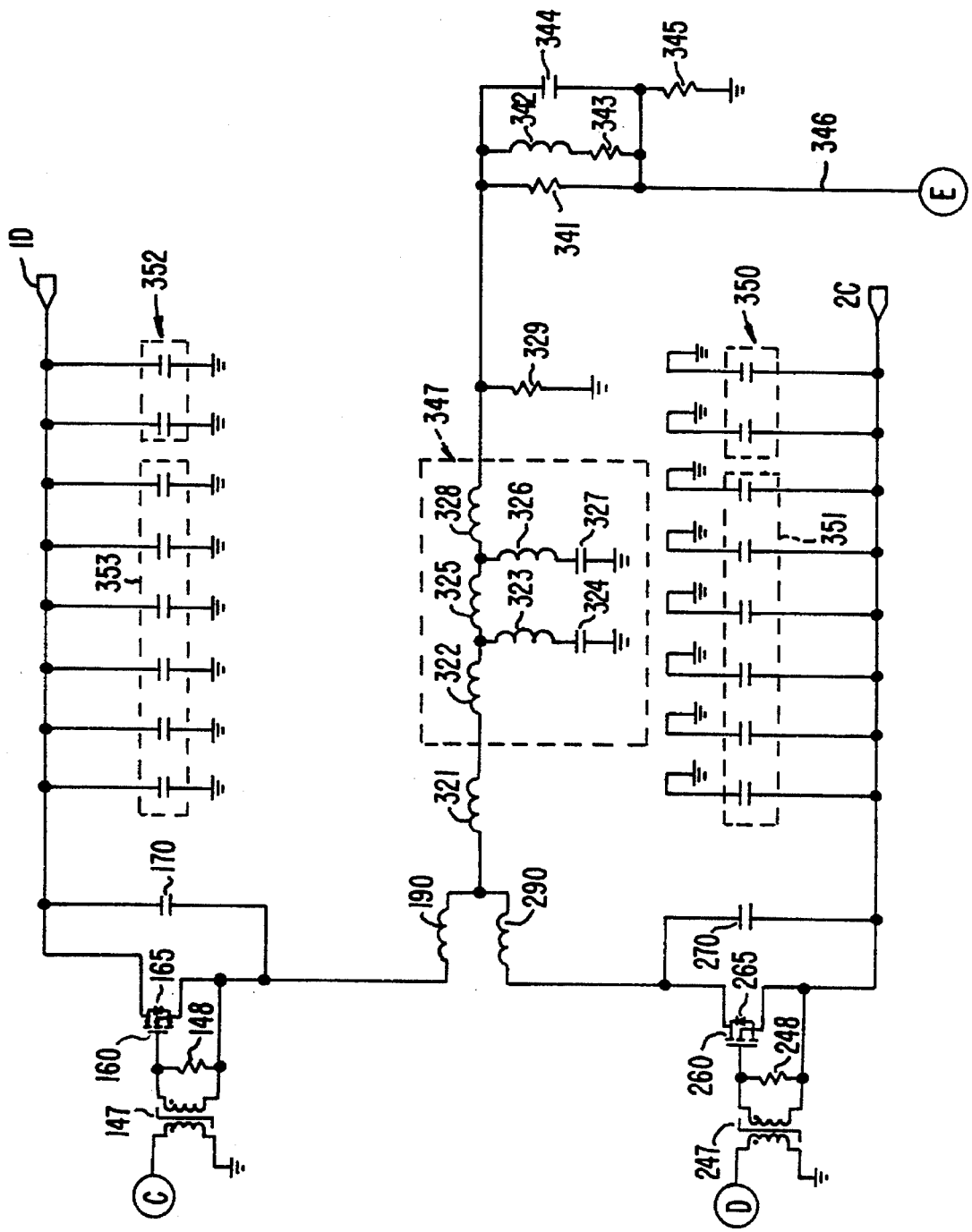
FIG. 17 is a schematic of ZVS-MRC circuits and a low-pass filter and voltage supply rails constructed according to the principles of the invention.

Turning to FIG. 17, isolating transformer 147 having an impedance ratio of four to one is coupled to resistor 148, which is, in turn, coupled to the gate and source of transistor 160. Resistor 148 is also coupled to the anode of antiparallel diode 165, resonant capacitor 170 and resonant inductor 190.

In normal operation, a PWM signal output from comparator 100 is applied to the bases of transistors 126 and 131, as well as to capacitor 128 through resistor 129. When the signal rises from low to high voltage, transistor 126 operates in normal, active mode, and capacitor 128 allows current to flow as a result of the change in voltage. Transistor 126 acts as a current sink and resistor 127 limits current flow to prevent the transistor from becoming saturated. Concurrently, transistor 131 is in cutoff mode (i..e., both emitter and collector junctions are reverse-biased). This operation enables transistors 121 and 141 to operate in normal, active mode; allowing current to flow through the primary winding of step-down transformer 147. The secondary winding delivers sufficient energy to transistor 160 to switch this transistor on. Transformer 147 also isolates transistor 160 and provides impedance matching.

When the PWM signal output from comparator 100 drops from high to low voltage, transistor 126 operates in cutoff mode, and transistor 131 now operates in normal, active mode. The drop in voltage enables capacitor 128 to discharge through transistor 131, which operates as a current source. Resistor 130 sufficiently limits current flow to prevent this transistor from becoming saturated. This operation enables transistors 136 and 142 to operate in normal, active mode; discharging capacitor 144 and dropping the voltage level applied to transformer 147 so to switch off transistor 160. Referring to FIG. 8, signal 505 represents a typical output signal from gate drive 120 and applied to the gate of transistor 160.

As noted above, transistors 121, 126, 131, 136, 141 and 142 operate in non-saturated mode when active, thereby minimizing response time of gate drive 120 to PWM signals output from comparator 100.

In addition, gate drive 120 employs two fail-safe mechanisms to minimize erroneous operation and thereby avoid potential sources of distortion. During normal operation, a PWM signal output from comparator 100 will periodically rise and fall, as illustrated by signal 503 of FIG. 7. When this signal rises, transistors 126, 121 and 141 are active, while transistors 131, 136 and 142 are in cutoff mode. Conversely, when this signal falls, the reverse is true; i.e., transistors 126, 121 and 141 are in cutoff mode and the remaining are active. Accordingly, positive d.c. power source 1C is always isolated from negative d.c. power source 2B during operation, thereby preventing damaging current from shooting through the circuit.

Furthermore, when the input signal to gate drive 120 is steady-state (i.e., non-oscillating) for a prolonged period of time, capacitor 128 prevents current flow through transistor 126 (as a sink) or transistor 131 (as a source). Accordingly, gate drive 120 is turned off—thereby preventing amplifier operation when receiving abnormal (i.e., non-oscillating) input from comparator circuit 100.

As shown in FIG. 16, gate drive 220 employs the identical circuitry described above with respect to gate drive 120. Accordingly, the foregoing description applies equally to gate drive 220.

F. Resonant Circuit

As shown in FIG. 17, antiparallel diode 165 and resonant capacitor 170 are connected in parallel across the source and drain of transistor 160. The drain of this transistor is also connected to positive d.c. power source 1D and the source is connected to resonant inductor 190. Transistor 260 is configured in similar fashion, except that the source of transistor 260 is connected to negative d.c. power source 2C, and the drain is coupled to resonant inductor 290.

As noted above, the resonant circuit elements and antiparallel diodes connected to transistors 160 and 260 enable the periodic application of zero and non-zero voltage levels across each transistor. More specifically, the combination of capacitor-inductor pairs 170, 190 and 270, 290 resonating independently as well as collectively, and diodes 165 and 265 conducting periodically, create alternating zero and non-zero voltage levels across each transistor. To minimize switching losses and stresses and thereby enable increased switching frequency of up to several megahertz, transistors 160 and 260 are switched only when zero volts appears across each transistor (i.e., $V_{ds}=0$).

For the purposes of discussing resonant circuit operation, modulating signals 501 and 502 of FIG. 7 are assumed to be output from amplifiers 41 and 61, respectively.

At the start of operation, ramp signal generator circuit 10 is off. Comparators 100 and 200, therefore, receive permanently high voltage reference signals and produce permanently low outputs (see Section D, above). Accordingly, gate drive circuits 120 and 220 are poised for rising-edge input signals—signals that will switch transistors 160 and 260 on. This start-up arrangement is particularly advantageous since current must first build up in inductors 190 and 290 before any resonant operation may occur. Such is achieved when transistors 160 and 260 are simultaneously switched on.

Turning on ramp generator circuit 10 via switch 28 results in a drop of the voltage reference signal (due to the discharge of capacitor 109 as discussed above), followed by a gradual rise in potential, illustrated by signal 500 of FIG. 7. The drop in signal 500 causes comparators 100 and 200 to produce rising edges 509 and 510 of PWM signals 503 and 504, respectively, as shown in FIG. 7. These edges activate gate drives 120 and 220 which switch transistors 160 and 260 on. Once both transistors are on, current through inductors 190 and 290 increases linearly since the constant d.c. voltage drop from positive d.c. power source 1D to negative d.c. power source 2C appears across these elements.

When signal 504 drops at falling edge 511, transistor 260 switches off and inductor 290 resonates with capacitor 270. Concurrently, an increasing voltage potential appears across transistor 260. Later in the same ramp period, signal 503 drops at falling edge 512, switching transistor 160 off. When both transistors are off, resonant capacitors 170, 270 and inductors 190, 290 resonate with each other. This results in an increasing and then decreasing voltage potential appearing across both transistors. Referring to FIG. 8, the resonating potential across transistor 160, represented by a single pulse of signal 506, reaches zero through resonant oscillations between capacitors 170, 270 and inductors 190, 290. The resonating voltage potential across transistor 260 subsequently reaches zero through resonant oscillations between capacitor 270 and inductor 290.

Once the drain to source voltage (i.e., $V_{ds}$) of a transistor reaches zero volts, its corresponding antiparallel diode begins to conduct for a limited period of time. For example, when $V_{ds}$ of transistor 160 becomes zero, current from inductor 190—which is negative—passes through diode 165. Similarly, when $V_{ds}$ of transistor 260 becomes zero, current begins to pass through diode 265. To achieve zero voltage turn on, transistors 160 and 260 are switched on while antiparallel diodes 165 and 265 conduct. Over time, the current through these diodes ultimately degrades to zero. At such time, current polarity reverses resulting in current flow through transistors 160 and 260.

The switching cycle is now repeated, starting with the gradual build up of current in inductors 190 and 290 (since both switching transistors are on). This will continue until one of the transistors switches off, causing resonant operation to begin with the capacitor and inductor coupled to the off transistor. At the same time, amplifier output is controlled by the on transistor. A detailed discussion of resonant circuit operation (in ZVS-MRC architectures) can be found in Maksimovic, the disclosure of which is hereby incorporated by reference.

As the foregoing description illustrates, switching of transistors 160 and 260 must be closely coordinated with the resonant operation of capacitors 170, 270 and inductors 190, 290 to ensure transistor switching occurs during periods of zero voltage. Accordingly, the switching frequency and allowable pulse widths of PWM signals 503 and 504 are determined relative to the resonant component values.

The resonant circuit coupled to transistors 160 (i.e., capacitor 170 and inductor 190) and 260 (i.e., capacitor 270 and inductor 290) operates at a resonant frequency ($f_r$) defined by equation (1), where $C_r$ is the capacitance of capacitors 170 or 270 and $L_r$ is the inductance of inductors 190 or 290, respectively.

$$f_r=\omega_r/2\pi=1/2\pi(L_r/C_r)^{1/2} \tag{1}$$

The switching frequency (i.e., $f_s$—the frequency of ramp signal 500) is set at some value less than $f_r$ to allow sufficient time within a particular switching period for resonant oscillation to occur. As shown in FIG. 8, the oscillations between resonant circuit elements—as illustrated by waveform 506—must be complete within a half-cycle of signal 505 (operating at $f_s$). In this embodiment of the invention, as in the DC-to-DC converter prior art, the relationship of the switching frequency to the resonant frequency is the same as discussed in Maksimovic, the disclosure of which is hereby incorporated by reference.

Further, the allowable width of the rectangular pulses of PWM signals 503 and 504 is also influenced by the resonant element values. As discussed above, non-zero voltage levels oscillate across transistors 160 and 260 when these transistors are switched off. Accordingly, the off portion of a ramp period, such as portion 513 of FIG. 7, must be sufficiently wide to enable a voltage level to rise and fall across a transistor (as illustrated by a single pulse of waveform 506 of FIG. 8) before switching the transistor on. However, this off portion must also be sufficiently narrow to ensure both transistors are switched on before their corresponding antiparallel diodes stop conducting, as noted above. The dimensions of ramp signal 500 (i.e., peak to peak value, slope of incline, etc.) as determined by the size of capacitor 109, element values of circuit 33 and voltage level of terminal 1A may be used to modify the width of off portion 513.

G. Averaging Filter

Referring to FIG. 17, positive and negative d.c. power sources 1D and 2C are connected to a series of decoupling capacitors, 352,353 and 350,351 respectively.

Inductor 321 is coupled to the node between inductors 190 and 290; i.e., the electrical midpoint of these inductors. Inductor 321 (itself functioning as a low-pass filter) is coupled to low-pass filter 347 having Inverse Chebyshev characteristics. Filter 347 includes inductors 322, 325 and 328 coupled in series. Disposed between inductors 322 and 325 is a notch filter constructed from inductor 323 and capacitor 324. Similarly, disposed between inductors 325 and 328 is a notch filter constructed from inductor 326 and capacitor 327. Filter 347 has a cutoff frequency equal to the switching frequency of ramp generator circuit 10 (typically of several megahertz).

The output filter of this circuit removes as much of the switching (i.e., ripple) component as possible, leaving a relatively clean, demodulated output signal to be applied to the load.

Inductor 328, located at the output of filter 347, is connected to a damping resistor 329 and a load, which in the present embodiment is a yoke. The equivalent circuit parameters of this yoke are an inductance (represented by inductor 342) in series with a resistance (represented by resistor 343) and shunted by a capacitance (represented by capacitor 344). Resistor 341, placed in parallel with the yoke, is a damping resistance used to control the Q of the yoke at resonance. Resistor 345, coupled to the yoke assembly, is a current sense resistor that samples yoke current.

Resistor 341 is also connected to feedback loop 346, which is coupled to the inverting input of amplifier 34 through resistor 3F, as shown in FIG. 15. This feedback loop provides for system stability and distortion reduction.

H. Bridge Circuit

Figure 18:
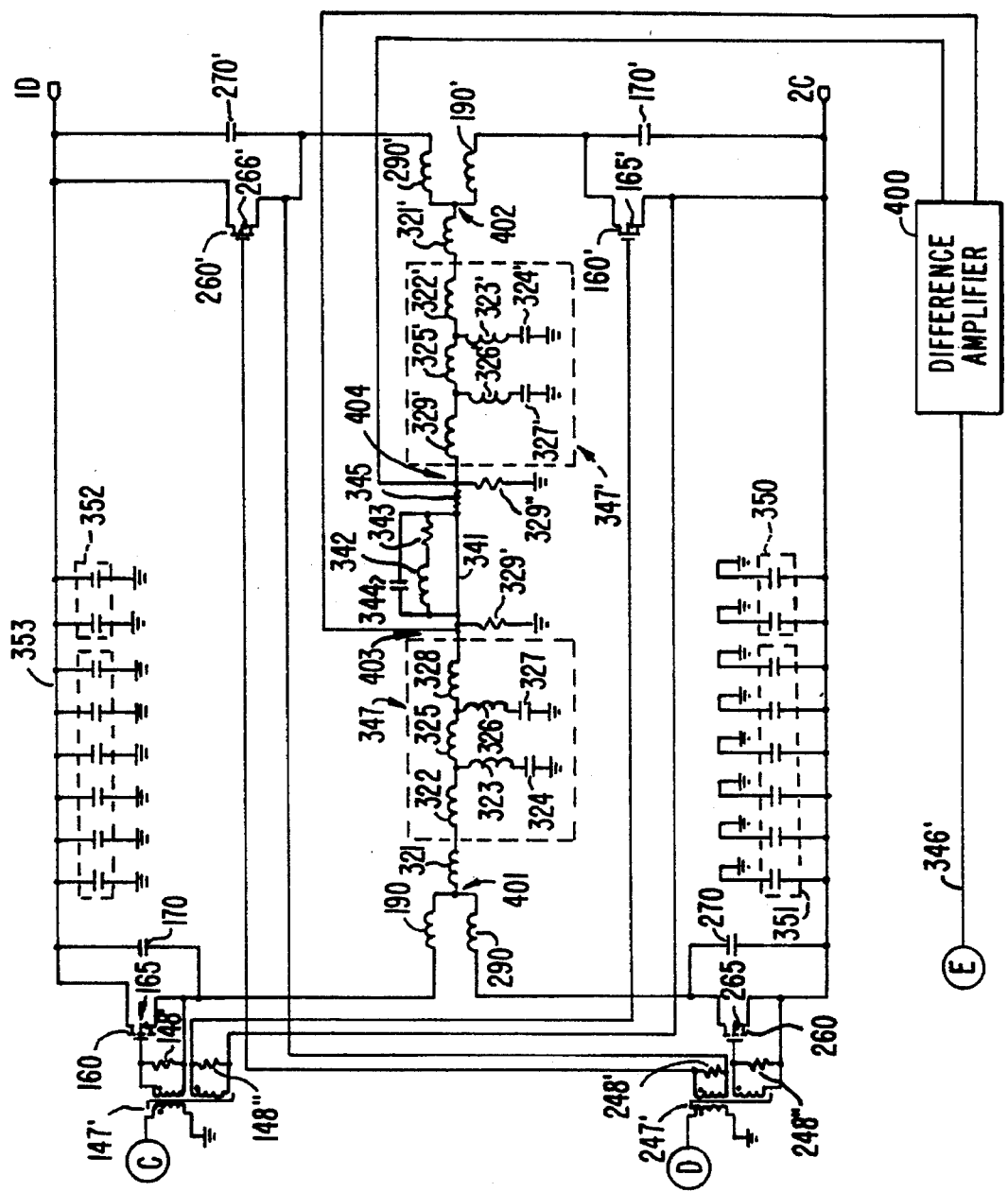
FIG. 18 is an alternate embodiment of the circuit shown in FIG. 17, incorporating a bridge circuit.

An alternate embodiment to the circuit shown in FIG. 17 is illustrated in the bridge circuit of FIG. 18. The architecture of this circuit is similar to the circuit of FIG. 17, using many of the same circuit elements.

1. Resonant Circuits

Referring to FIG. 18, the primary winding of transformer 147' is coupled to capacitor 144 and resistor 146 of gate drive circuit 120 (FIG. 16). A first secondary winding is coupled to resistor 148' and the gate and source of transistor 160. Antiparallel diode 165 and resonant capacitor 170 are connected in parallel across the source and drain of transistor 160. The drain of this transistor is also connected to positive d.c. power source 1D and the source is connected to resonant inductor 190.

Similarly, the primary winding of transformer 247' is coupled to capacitor 244 and resistor 246 of gate drive circuit 220 (FIG. 16). A second secondary winding is coupled to resistor 248" and the gate and source of transistor 260. Antiparallel diode 265 and resonant capacitor 270 are connected in parallel across the source and drain of transistor 260. The source of this transistor is connected to negative d.c. power source 2C and the drain is coupled to resonant inductor 290.

The operation of transistors 160 and 260 and their associated resonant elements is described in Section F, above.

The circuit of FIG. 18 also includes a second set of transistors and resonant elements identified by the prime element numbers in the right-hand side of FIG. 18. Specifically, a second secondary winding of transformer 147' is coupled to resistor 148" and the gate and source of transistor 160'. Antiparallel diode 165' and resonant capacitor 170' are connected in parallel across the source and drain of transistor 160'. The source of this transistor is also connected to negative d.c. power source 2C and the drain is connected to resonant inductor 190.'

Similarly, a first secondary winding of transformer 247' is coupled to resistor 248' and the gate and source of transistor 260'. Antiparallel diode 265' and resonant capacitor 270' are connected in parallel across the source and drain of transistor 260'. The drain of this transistor is connected to positive d.c. power source 1D and the source is coupled to resonant inductor 290'.

The operation of transistors 160' and 260' and their associated resonant elements is analogous to the description provided in Section F, above, with respect to transistors 260 and 160, respectively.

In the operation of the circuit of FIG. 18, transistors 160 and 160' are identically driven. Similarly, transistors 260 and 260' are identically driven. The result is equal and opposite voltage potentials being applied to nodes 401 and 402. Accordingly, such operation results in twice the output voltage swing applied to the amplifier load for a given maximum output limit on nodes 401 and 402. This configuration is particularly suited for low frequency operation.

2. Averaging Filter

Referring to FIG. 18, positive and negative d.c. voltage sources 1D and 2C are connected to a series of decoupling capacitors 352,353 and 350,351 respectively.

Additionally, inductors 190 and 290 are coupled to filter 347 through inductor 321, as described in Section G above. The composition of filter 347 is the same as described in Section G. In identical fashion, inductors 190' and 290' are coupled to filter 347' through inductor 321'. The composition and structure of filter 347' is the same as filter 347. The outputs of filters 347 and 347' are coupled to damping resistors 329' and 329". Disposed between these resistors are circuit elements 341–345 which represent the load of the amplifier (i.e., a yoke) coupled to current sense resistor 345. The composition and structure of the yoke is the same as that described in Section G, above.

Finally, a conventional difference amplifier 400 is coupled to nodes 405 and 404. The output of this amplifier, is coupled to feedback loop 346', which is itself coupled to the inverting input of amplifier 34 through resistor 3F, as shown in FIG. 15. This feedback loop provides for system stability and distortion reduction.

I. Component Value/Part Number

Tables 1–8, below, provide component values, voltages, and select part numbers (i.e., component number: value, voltage or part number) of the circuits of FIGS. 15–18, constructed according to the principles of the invention. The units are included in the column header, unless otherwise specified in the list. The switching frequency of this amplifier is 3 Mhz.

TABLE 1

Resistors, capacitors, one-shot circuits, comparators and power sources of FIG. 15.

| Resistors (Ohms) | Capacitors (pf) | One-Shot Circuits | Comparator | Power Source (V) |
|---|---|---|---|---|
| 3A:4.7K | 3B:2.7uf | 14,20: | 100,150, | 1A:15 |
| 3C:4.7K | 13:100 | 54LS221. | 175,200: | 1B:5 |
| 3D:1.5K | 24:12 | | MAX900 ™ | 1E:5 |
| 3E:2.2K | 27:0.022uf | | | 2A:−5 |
| 3F:470 | 29:27 | | | |
| 11:1K | 44:5 | | | |
| 12:2.49K | 51:5 | | | |
| 15:820 | 56:100 | | | |
| 16:820 | 63:5 | | | |
| 17:300 | 66:5 | | | |
| 18:820 | 69:100; | | | |
| 19:2.49K | 102:18uf | | | |
| 21:820 | 109:100 | | | |
| 22:470 | | | | |
| 23:47 | | | | |

TABLE 1-continued

Resistors, capacitors, one-shot circuits, comparators and power sources of FIG. 15.

| Resistors (Ohms) | Capacitors (pf) | One-Shot Circuits | Comparator | Power Source (V) |
|---|---|---|---|---|
| 26:200 | | | | |
| 42:4.7K | | | | |
| 43:1K | | | | |
| 45:10K | | | | |
| 46:2.2K | | | | |
| 47:2K | | | | |
| 50:1K | | | | |
| 52:4.7K | | | | |
| 53:510 | | | | |
| 54:220 | | | | |
| 55:300 | | | | |
| 62:4.7K | | | | |
| 64:1K | | | | |
| 65:1K | | | | |
| 67:4.7K | | | | |
| 68:300 | | | | |
| 101:22 | | | | |
| 103:910 | | | | |
| 104:12K | | | | |
| 106:5.1K | | | | |
| 107:360 | | | | |
| 110:470 | | | | |
| 111:20K | | | | |
| 202:910 | | | | |

TABLE 2

Transistors, diodes and operational amplifiers of FIG. 15.

| Transistors | Diodes | Operational Amplifiers |
|---|---|---|
| 25:2N4857 | 105:1N4150 | 34: AD848 |
| 108: 2N3227 or N2369A | | 41: AD847 |
| | | 48: AD711 |
| | | 61: AD847 |

TABLE 3

Resistors, capacitors and power sources of FIG. 16.

| Resistors (Ohms) | Capacitors (pf) | Power Source (V) |
|---|---|---|
| 122,222:68 | 135,235:68 | 128,228:0.01uf  1C:15 |
| 123,223:68 | 137,237:1.5K | 144,244:0.1uf  2B:−15 |
| 125,225:100 | 138,238:1.5K | |
| 127,227:39 | 139,239:15 | |
| 129,229:10M | 140,240:15 | |
| 130,230:39 | 143,243:2.2 | |
| 132,232:100 | 145,245:2.2 | |
| 134,234:68 | 146,246:470 | |

TABLE 4

Transistors and diodes of FIG. 16.

| Transistors | Diodes |
|---|---|
| 121,221: 2N2907A | 124,224,133,233: 1N4150 |
| 126,226: 2N2857 or 2N5835 | |
| 131,231: 2N4857 | |
| 136,236: 2N2222A | |
| 141,241: 2N3725A or 2N3735 | |
| 142,242: 2N3407 | |

TABLE 5

Resistors, capacitors, inductors and power sources of FIG. 17.

| Resistors (ohms) | Capacitors (pf) | Inductors (Nh) | Power Source (V) |
|---|---|---|---|
| 148,248:2.2K | 170,270:1790 | 190,290:812 | 1D: |
| 329:14.7 | 324:0.014434uf | 321:200 | +27 or |
| 341:440 | 327:8188 | 322:6.2uH | +33 |
| 343:0.4 | 344:62 | 323:0.20uH | |
| 345:0.833 | 350:330uf | 325:1.97uH | 2C: |
| | 351:18uf | 326:0.1758uH | −27 or |
| | 352:330uf | 328:0.364uH | −33. |
| | 353:18uf | 342:40uH | |

TABLE 6

Transistors and transformers of FIG. 17.

| Transistors | Transformers |
|---|---|
| 160,260: IRFM240 or IRF240 | 147: 8T-4T |
| | 247: 8T-4T |

TABLE 7

Resistors, capacitors, inductors and power sources of FIG. 18.

| Resistors (Ohms) | Capacitors (pf) | Inductors (Nh) | Power Source (V) |
|---|---|---|---|
| 148',148", 248',248": 2.2K | 170,170', 270,270': 1790; | 190,190', 290,290':812 | 1D: +27 or +33 |
| 329',329": 14.7 | 324,324': 0.014434uf | 321,321':200 322,322':6.2uH | 2C: −27 or −33. |
| 341:440 343:0.4 | 327,327':8188 | 323,323':0.20uH | |
| 345:0.833 | 344:62 | 325,325':1.97uH | |
| | 350:330uf | | |
| | 351:18uf | 326,326':0.1758 uH | |
| | 352:330uf | | |
| | 353:18uf | | |
| | | 328,328': 0.364uH | |
| | | 342:40uH | |

TABLE 8

Transistors and transformers of FIG. 18.

| Transistors | Transformers |
|---|---|
| 160,160': IRFM240 or IRF240 | 147': 8T-4T-4T |
| 260,260': IRFM240 or IRF240 | 247': 8T-4T-4T |

While the above is a complete description of the preferred embodiment of the invention, various modifications, alternatives and equivalents may be used. Therefore, the above description should not be taken as limiting the scope of the invention which is defined by the appended claims.

What is claimed is:

1. A power amplifier comprising:

a first resonant inductor network coupled to first and second nodes;

a first electrical switching device coupled to said first node having a first control input, said first electrical switching device coupling and decoupling said first resonant inductor network to a relatively positive power source when switched on and off, respectively;

a second electrical switching device coupled to said second node having a second control input, said second electrical switching device coupling and decoupling said first resonant inductor network to a relatively negative power source when switched on and off, respectively;

a first resonant capacitor coupled across said first electrical switching device, said first resonant capacitor selected to resonate with said first resonant inductor network at a first frequency resulting in zero and non-zero voltage levels being periodically placed across said first electrical switching device;

a first antiparallel diode coupled across said first electrical switching device, said first antiparallel diode beginning to conduct when a zero voltage level is initially placed across said first electrical switching device;

a second resonant capacitor coupled across said second electrical switching device, said second resonant capacitor selected to resonate with said first resonant inductor network at said first frequency resulting in zero and non-zero voltage levels being periodically placed across said second electrical switching device;

a second antiparallel diode coupled across said second electrical switching device, said second antiparallel diode beginning to conduct when a zero voltage level is initially placed across said second electrical switching device;

a first low-pass filter coupled to said first resonant inductor network;

a load coupled to an electrical midpoint of said first resonant inductor network through said first low-pass filter; and means, coupled to said first and second electrical switching devices, for providing first and second control signals to said first and second control inputs, respectively, said first control signal operating at a second frequency and switching said first electrical switching device on and off only when a zero voltage level is placed across said first electrical switching device, and said second control signal operating at said second frequency and switching said second electrical switching device on and off only when a zero voltage level is placed across said second electrical switching device.

2. The power amplifier of claim 1 wherein said control signal means comprises first and second comparators, said first and second comparators generating first and second pulse-width-modulation signals comprising a series of rectangular pulses having rising and falling edges, the rising edge of each pulse of said first pulse-width-modulation signal occurring at approximately the same time as the rising edge of each pulse of said second pulse-width-modulation signal.

3. The power amplifier of claim 2 wherein the falling edge of each pulse of said first and second pulse-width-modulation signals is controlled by an analog input voltage signal.

4. The power amplifier of claim 3 wherein said control signal means further comprises:

a first gate drive circuit, coupled to said first comparator and said first control input, which amplifies said first pulse-width-modulation signal before transferring said first pulse-width-modulation signal to said first control input; and a second gate drive circuit, coupled to said second comparator and said second control input, which amplifies said second pulse-width-modulation signal before transferring said second pulse-width-modulation signal to said second control input.

5. The power amplifier of claim 4 wherein said control signal means further comprises:

means, coupled to said first and second comparators, for splitting said analog input voltage signal into first and second voltage signals, said first and second voltage signals having midpoint values equal to an electrical ground;

means coupled to said splitting means for biasing said first and second voltage signals before transferring said first and second voltage signals to said first and second comparators, respectively; and means coupled to said first and second comparators for generating a periodic reference voltage.

6. The power amplifier of claim 4 wherein said control signal means further comprises:

means, coupled to said first and second comparators, for biasing an input analog voltage signal and transferring a biased input analog voltage signal to said first and second comparators, said biased signal operating as an input voltage at said first comparator and as a reference voltage at said second comparator;

means coupled to said first and second comparators for generating a periodic voltage, said periodic voltage operating as a reference voltage at said first comparator; and means coupled to said periodic voltage generating means and said second comparator for inverting said periodic voltage, said inverted periodic voltage operating as an input voltage at said second comparator.

7. The power amplifier of claim 4 wherein said first and second gate drive circuits each contain a fail-safe capacitor which prevents respective gate drive operation when said first or second pulse-width-modulation signal fails to oscillate for a prolonged period of time.

8. The power amplifier of claim 5 wherein said periodic reference voltage generating means comprises first and second one-shot circuits configured to trigger periodic ramp signals at said second frequency.

9. The power amplifier of claim 8 wherein said periodic reference voltage generating means further comprises a voltage supply circuit coupled to a charging capacitor that creates a ramp signal of proper size to enable voltage levels across said first and second electrical switching devices resonate to non-zero values while said first and second electrical switching devices are switched off.

10. The power amplifier of claim 4 further comprising first and second logical AND circuits disposed between said first and second comparators and said first and second gate drive circuits, respectively, said first AND circuit passing said first pulse-width-modulation signal and said second AND circuit passing said second pulse-width-modulation signal, said first and second AND circuits being controlled by a gate pulse circuit which synchronizes said first and second pulse-width-modulation signals to ensure said first and second electrical switching devices switch on simultaneously.

11. The power amplifier of claim 1 wherein said second frequency is less than said first frequency.

12. The power amplifier of claim 1 wherein said first low-pass filter and said first resonant inductor network form a T network.

13. The power amplifier of claim 1 wherein said relatively positive power source and said relatively negative power source are positive and negative terminals of a single power source.

14. The power amplifier of claim 5 further comprising a feedback line coupled to said first low-pass filter and said splitting means.

15. The power amplifier of claim 6 further comprising a feedback line coupled to said first low-pass filter and said biasing and transferring means.

16. The power amplifier of claim 1 further comprising:

a second resonant inductor network coupled to third and fourth nodes;

a third electrical switching device coupled to said third node having a third control input, said third electrical switching device coupling and decoupling said second resonant inductor network to the relatively negative power source when switched on and off, respectively;

a fourth electrical switching device coupled to said fourth node having a fourth control input, said fourth electrical switching device coupling and decoupling said second resonant inductor network to the relatively positive power source when switched on and off, respectively;

a third resonant capacitor coupled across said third electrical switching device, said third resonant capacitor selected to resonate with said second resonant inductor network at said first frequency resulting in zero and non-zero voltage levels being periodically placed across said third electrical switching device;

a third antiparallel diode coupled across said third electrical switching device, said third antiparallel diode beginning to conduct when a zero voltage level is initially placed across said third electrical switching device;

a fourth resonant capacitor coupled across said fourth electrical switching device, said fourth resonant capacitor selected to resonate with said second resonant inductor network at said first frequency resulting in zero and non-zero voltage levels being periodically placed across said fourth electrical switching device;

a fourth antiparallel diode coupled across said fourth electrical switching device, said fourth antiparallel diode beginning to conduct when a zero voltage level is initially placed across said fourth electrical switching device;

a second low-pass filter coupled to said second resonant inductor network and said load, which is coupled to an electrical midpoint of said second resonant inductor network through said second low-pass filter; and means, coupled to said third and fourth electrical switching devices, for providing said first and second control signals to said third and fourth control inputs, respectively, said first control signal operating at said second frequency and switching said third electrical switching device on and off only when a zero voltage level is placed across said third electrical switching device, and said second control signal operating at said second frequency and switching said fourth electrical switching device on and off only when a zero voltage level is placed across said fourth electrical switching device.

\* \* \* \* \*